United States Patent
Oyama et al.

(10) Patent No.: US 9,711,638 B2
(45) Date of Patent: Jul. 18, 2017

(54) SEMICONDUCTOR DEVICE USING DIAMOND

(71) Applicant: DENSO CORPORATION, Kariya, Aichi-pref. (JP)

(72) Inventors: Kazuhiro Oyama, Kariya (JP); Toshiharu Makino, Tsukuba (JP); Masahiko Ogura, Tsukuba (JP); Hiromitsu Kato, Tsukuba (JP); Daisuke Takeuchi, Tsukuba (JP); Satoshi Yamasaki, Tsukuba (JP); Norio Tokuda, Kanazawa (JP); Takao Inokuma, Kanazawa (JP); Takuma Minamiyama, Kanazawa (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/039,505

(22) PCT Filed: Nov. 25, 2014

(86) PCT No.: PCT/JP2014/005875
§ 371 (c)(1),
(2) Date: May 26, 2016

(87) PCT Pub. No.: WO2015/079671
PCT Pub. Date: Jun. 4, 2015

(65) Prior Publication Data
US 2016/0372590 A1 Dec. 22, 2016

(30) Foreign Application Priority Data
Nov. 29, 2013 (JP) ................................. 2013-248166

(51) Int. Cl.
*H01L 21/04* (2006.01)
*H01L 29/78* (2006.01)
(Continued)

(52) U.S. Cl.
CPC ...... *H01L 29/7813* (2013.01); *H01L 29/1602* (2013.01); *H01L 29/365* (2013.01);
(Continued)

(58) Field of Classification Search
CPC ....... H01L 21/0405; H01L 2021/28543; H01L 29/1602; H01L 29/66015
See application file for complete search history.

(56) References Cited

U.S. PATENT DOCUMENTS

2014/0145210 A1* 5/2014 Suzuki ................. H01L 21/041
257/77
2015/0295079 A1 10/2015 Nakano et al.

FOREIGN PATENT DOCUMENTS

| JP | 07221328 A | * | 8/1995 | ........... H01L 29/872 |
| JP | H07-221328 A | | 8/1995 | |
| JP | 2009-054641 A | | 3/2009 | |

OTHER PUBLICATIONS

Oyama et al., "High performance of diamond p+-i-n+ junction diode fabricated using heavily doped p+ and n+ layers". Applied Physics Letters, 2009, vol. 94, p. 152109. (Cited in the PCT Search Report).
(Continued)

*Primary Examiner* — Jae Lee
(74) *Attorney, Agent, or Firm* — Posz Law Group, PLC

(57) ABSTRACT

A semiconductor device includes a MISFET having: a diamond substrate; a drift layer having a first layer with a first density for providing a hopping conduction and a second layer with a second density lower than the first density, and having a δ dope structure; a body layer on the drift layer; a source region in an upper portion of the body layer; a gate insulation film on a surface of the body layer; a gate electrode on a surface of the gate insulation film; a first electrode electrically connected to the source region and a channel region; and a second electrode electrically connected to the diamond substrate. The MISFET flows current in the drift layer in a vertical direction, and the current flows between the first electrode and the second electrode.

8 Claims, 5 Drawing Sheets

(51) Int. Cl.
  *H01L 29/47* (2006.01)
  *H01L 29/872* (2006.01)
  *H01L 29/16* (2006.01)
  *H01L 29/36* (2006.01)
  *H01L 29/66* (2006.01)
  *H01L 29/417* (2006.01)

(52) U.S. Cl.
  CPC ........ *H01L 29/47* (2013.01); *H01L 29/66045* (2013.01); *H01L 29/7827* (2013.01); *H01L 29/7839* (2013.01); *H01L 29/872* (2013.01); *H01L 29/41766* (2013.01)

(56) References Cited

OTHER PUBLICATIONS

Minamiyama et al., "Boron delta-doped diamond structures", The 4th International Symposium on Organic and Inorganic Electronic Materials and Related Nanotechnologies (EM-MANO 2013), Kanazawa Japan, p. 1-31. (Discussed on pp. 1-3 of the specification).

Denisenko et al., "Diamond power devices. Concepts and limits", Diamond and Related Materials 14 (2005), pp. 491-498. (Discussed on pp. 17-18 of the specification).

\* cited by examiner

SEMICONDUCTOR DEVICE USING DIAMOND

CROSS REFERENCE TO RELATED APPLICATIONS

This application is the U.S. national phase of International Patent Application No. PCT/JP2014/005875 filed on Nov. 25, 2014 and is based on Japanese Patent Application No. 2013-248166 filed on Nov. 29, 2013, the disclosures of which are incorporated herein by reference.

TECHNICAL FIELD

The present disclosure relates to a semiconductor device made of diamond semiconductor.

BACKGROUND ART

Conventionally, a semiconductor device using diamond as semiconductor material is proposed (see Non-patent Literature No. 1). Diamond semiconductor has a deep impurity level, for example, when boron (i.e., B) is used as a P type impurity, the impurity level of diamond semiconductor is 0.37 eV, and, when phosphorus (i.e., P) is used as a N type impurity, the impurity level is 0.57 eV. Further, thermal voltage at room temperature is 0.026 eV. Thus, as shown in FIG. 7, a carrier density at room temperature is small. When the impurity density is not so large (e.g., $1 \times 10^{18}$ cm$^{-3}$ in the drawing), the diamond semiconductor provides band conduction, and therefore, a resistance of a semiconductor layer becomes very large. On the other hand, when the impurity density becomes larger so that a hopping conduction is dominant (e.g., about $1 \times 10^{19}$ cm$^{-3}$ or more), the resistance of the semiconductor layer is rapidly reduced. Here, in FIG. 7, T represents temperature indicated by kelvin (i.e., K). The value of 1000/T at room temperature is about 3.3.

In a semiconductor device having a PN junction, when a reverse voltage is applied to the PN junction between the P type layer and the N type layer, each of which has a high impurity density, The maximum electric field intensity at the PN junction becomes larger. Accordingly, a blocking voltage becomes smaller. When the impurity density s reduced in order to increase the blocking voltage, the maximum electric field intensity is also reduced, and the resistance of each of the P type layer and the N type layer becomes larger.

Accordingly, in the semiconductor device having the deep impurity level, when the blocking voltage is set to be larger, the resistance becomes larger. For example, in a FET having the large blocking voltage, the resistance is large, and therefore, a difficulty arises such that the conduction loss becomes larger.

PRIOR ART LITERATURES

Non-Patent Literature

Non Patent Literature 1: Takuma Minamiyama, Norio Tokuda, Masahiko Ogura, Satoshi Yamasaki, Takao Inokuma, Boron delta-doped diamond structures, The 4th international Symposium on Organic and Inorganic Electronic Materials and Related Nanotechnologies (EM-MANO 2013), Kanazawa Japan, P1-31

SUMMARY OF INVENTION

It is an object of the present disclosure to provide a semiconductor device made of diamond semiconductor, which reduces a maximum electric field intensity and a resistance.

According to a first aspect of the present disclosure, a semiconductor device includes a MISFET as a semiconductor element. The MISFET includes: a diamond substrate having a first conductive type and made of diamond semiconductor; a drift layer having a first layer with the first conductive type and a first density for providing a hopping conduction and a second layer with the first conductive type or an I type and a second density lower than the first density, and made of diamond semiconductor with a δ dope structure, in which the first layer and the second layer are alternately repeated; a body layer having a second conductive type, made of diamond semiconductor, and arranged on the drift layer; a source region having the first conductive type, made of diamond semiconductor, and arranged in an upper portion of the body layer; a gate insulation film arranged on a surface of the body layer, a part of the body layer contacting the gate insulation film providing a channel region; a gate electrode arranged on a surface of the gate insulation film; a first electrode electrically connected to the source region and the channel region; and a second electrode electrically connected to the diamond substrate. The MISFET flows current in the drift layer in a vertical direction as a direction crossing a plane of the first layer and the second layer, and the current flows between the first electrode and the second electrode.

In the semiconductor device having the above structure, the current flows in the drift layer in the vertical direction as a direction crossing a planar direction of the first layer and the second layer, so that the current flows between the first electrode and the second electrode. Accordingly, the carrier density is large even in the second layer as the low density layer, and therefore, it is possible to reduce the resistance. Thus, it is not necessary to increase the total impurity amount (i.e., the surface density or the dose amount) of the drift layer for the purpose of reduction of the resistance. Further, it is not necessary to increase the maximum electric field intensity in the drift layer. Accordingly, a breakdown voltage of the device is secured, and it is possible to reduce the resistance.

According to a second aspect of the present disclosure, a semiconductor device includes a Schottky diode as a semiconductor element. The Schottky diode includes: a diamond substrate having a first conductive type and made of diamond semiconductor; a drift layer having a first layer with the first conductive type and a first density for providing a hopping conduction and a second layer with the first conductive type or an I type and a second density lower than the first density, and made of diamond semiconductor with a δ dope structure, in which the first layer and the second layer are alternately repeated; a first electrode provided by a Schottly electrode and electrically contacting the drift layer in a Schottly contact manner; and a second electrode electrically connected to the diamond substrate. The Schottky diode flows current in the drift layer in a vertical direction as a direction crossing a planar direction of the first layer and the second layer, and the current flows between the first electrode and the second electrode. A total impurity density of the first conductive type in the drift layer is equal to or smaller than $1 \times 10^{13}$ cm$^{-2}$.

In the above structure, the current flows in the vertical direction as a direction crossing a planar direction of the first layer and the second layer, so that the current flows between the first electrode and the second electrode. Thus, it is not necessary to increase the total impurity amount (i.e., the surface density or the dose amount) of the drift layer for the purpose of reduction of the resistance. Further, it is not necessary to increase the maximum electric field intensity in the drift layer. Accordingly, the maximum electric field intensity is reduced, and it is possible to reduce the resistance.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

First Embodiment

A first embodiment of the present disclosure will be explained. In the present embodiment, a semiconductor device having a MISFET with a trench gate structure as a semiconductor device made of diamond semiconductor will be explained as an example. First, with reference to FIG. 1, the structure of the MISFET with the trench gate structure according to the present embodiment will be explained. Here, although FIG. 1 merely shows one cell of the MISFET, when multiple cells having a structure prepared by arranging bilaterally symmetrically the one cell in FIG. 1 with respect to a straight line of L1 as a symmetric line are formed, the semiconductor device having the MISFET with the trench gate structure according to the present embodiment is prepared.

Figure 1:
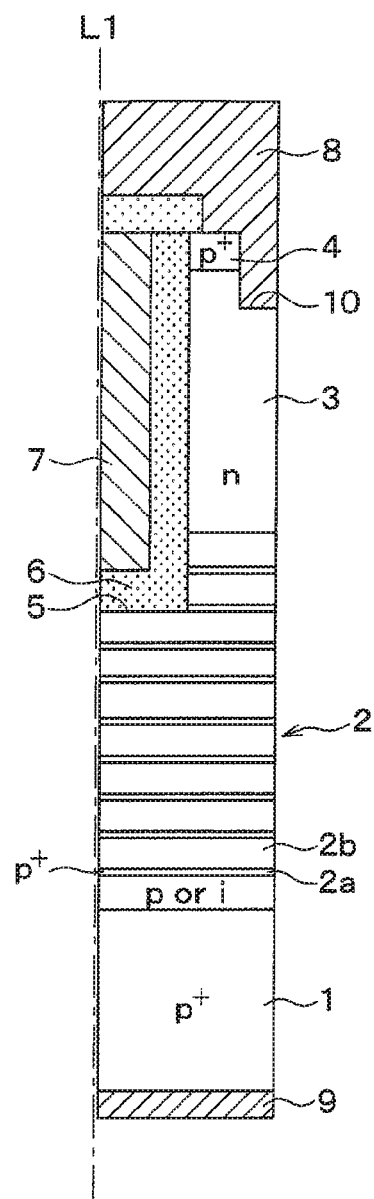
FIG. 1 is a cross sectional diagram of a semiconductor device having a MISFET with a trench gate structure made of diamond semiconductor according to a first embodiment of the present disclosure.

As shown in FIG. 1, a P type drift layer 2 made of diamond semiconductor, in which a P type impurity is doped, is formed on a P+ type diamond substrate 1 made of diamond semiconductor in which a P type impurity (such as boron) is highly doped. The fine structure of the P type drift layer 2 will be explained latter. The P type drift layer 2 has the δ dope structure. Specifically, the P type drift layer 2 has a structure such that a first layer 2a, provided by a P type layer having a low density or an i-type layer having an extremely low density so that an impurity is not substantially doped, and a second layer 2b, provided by a δ dope layer formed of a P type layer with a high density, are alternately repeated from the surface of the P+ type diamond substrate 1.

Further, a N type body layer 3 made of diamond semiconductor, in which a N type impurity (such as phosphorous) is doped, is formed on the P type drift layer 2. A P+ type source region 4 made of diamond semiconductor, in which the P type impurity is highly doped, is formed in an upper portion of the N type body layer 3. Further, a trench 5 is formed such that the trench 5 penetrates the N type body layer 3 and the P+ type source region 4, and reaches the P type drift layer 2. The N type body layer 3 and the P+ type source region 4 are arranged to contact a sidewall of the trench 5.

A gate insulation film 6 is formed on a whole surface of an inner wall of the trench 5 including a surface of the N type body layer 3. A gate electrode 7 formed on the surface of the gate insulation film 6 fills a part of or a whole of the inside of the trench 5. Thus, the structure having the gate insulation film 6 and the gate electrode 7 in the trench 5 provides the trench gate structure.

Here, although not shown in FIG. 1, the trench gate structure has a reed shape with a perpendicular direction of the drawing as a longitudinal direction, for example. Multiple trench gate structures are arranged in a stripe shaped manner at equal intervals along a right-left direction of the drawing, so that multiple cells are prepared.

A concavity 10 for exposing a part of the N type body layer 3 is formed at a center portion of the N type body layer 3, which is arranged between adjacent trenches 5, on a side opposed to the trench 5 via the P+ type source region 4.

A source electrode 8 corresponding to the first electrode is formed on the surface of the P+ type source region 4 and embedded in the concavity 10. The source electrode 8 contacts the N type body layer 3, which is exposed on the P+ type source region 4 and in the concavity 10, in a Ohmic contact manner or a Schottky contact manner. Here, the source electrode 8 is formed on an interlayer insulation film not shown in the drawing, so that the source electrode 8 is electrically isolated from a gate wiring, which is not shown in the drawing and is electrically connected to the gate electrode 7. Thus, the source electrode 8 electrically contacts the P+ type source region 4 and the N type body layer 3 via a contact hole, which is formed in the interlayer insulation film.

Further, a drain electrode 9 corresponding to the second electrode is formed on the backside of the P+ type diamond substrate 1 and is electrically connected to the P+ type diamond substrate 1. The above structure provides the MISFET having the P channel type and the reverse type trench gate structure.

Then, the detailed structure of the P type drift layer 2 accommodated in the MISFET having the trench gate structure will be explained.

As described above, the P type drift layer 2 has the δ dope structure such that a first layer 2a made of a P type layer having a low density or an I type layer, in which an impurity is poorly doped, and a second layer 2b made of a P type layer having a high density are alternately repeated.

The first layer 2a has an impurity density of the P type for providing a hopping conduction dominantly so that the density is set to be equal to or larger than $1\times10^{19}$ cm$^{-3}$. For example, the density of the first layer 2a is $1\times10^{20}$ cm$^{-3}$. It is preferable for the thickness of the first layer 2a to be thin. Specifically, when the thickness of the first layer 2a is equal to or smaller than 1 nanometer, the impurity amount (i.e., a surface density or a dope amount) of a whole of the P type drift layer 2 including the second layer 2b in addition to the first layer 2a can be reduced.

The second layer 2b has a density set to be smaller than the impurity density of the P type for providing the hopping conduction dominantly, so that the second layer 2b has a band conduction. For example, the impurity density of the second layer 2b is $1 \times 10^{15}$ cm$^{-3}$. The width of the second layer 2b may be any value. It is preferable for the width of the second layer 2b to be equal to or smaller than 100 nanometers.

Further, the total impurity amount (i.e., the surface density or the dose amount) of the first layer 2a and the second layer 2b is equal to or smaller than $1 \times 10^{13}$ cm$^{-2}$. A pitch distance of the first layer 2a, i.e., the distance between centers of adjacent first layers 2a, is equal to or smaller than 0.13 micrometers. This structure provides the drift layer 2 having the P type with the δ dope structure.

In the MISFET having the above structure, when the gate voltage is applied to the gate electrode 7, a part of the N type body layer 3 contacting the gate insulation film 6 arranged on a sidewall of the trench 5 is reversed and provides the P type channel, so that current flows between the source electrode 8 and the drain electrode 9. Thus, the current flows in the drift layer 2 having the P type with the δ dope structure along a perpendicular direction as a direction crossing a planar direction (i.e., a perpendicular direction with respect to the stacking direction) of each first layer 2a and each second layer 2b.

In a diamond semiconductor having a large ionization energy, when the P type impurity density is equal to or larger than $1 \times 10^{19}$ cm$^{-3}$, the hopping conduction becomes dominant. Thus, the ionization energy of the diamond semiconductor is reduced, and the hole density becomes large. This mechanism is not clearly specified. However, it is considered that the hole density increases even in a low density layer since a wave function spreads, or the hole density becomes large since the hole spreads and moves from the δ dope layer having the large hole density to the low impurity density layer.

Figure 2:
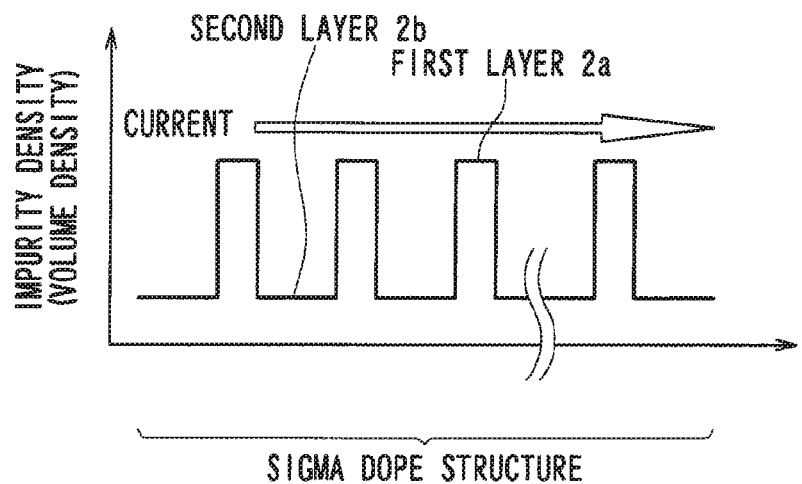
FIG. 2 is a diagram showing a relationship between an impurity density (i.e., a volume density) and current flow in a sigma dope structure.

For example, as shown in FIG. 2, in the δ dope structure, the impurity density increases at the position of the first layer 2a in a pulse manner, and the impurity density decreases at the position of the second layer 2b. In this structure, the current flows along the direction shown as an arrow in the drawing.

However, since the wave function expands, the hole exists at the position of the second layer 2b, and therefore, a feature may be provided such that the hole spreads from the position of the first layer 2a to the position of the second layer 2b. Thus, the hole density becomes large. Accordingly, the resistance becomes small in the low density layer, i.e., at the position of the second layer 2.

Alternatively, it may be considered that the hole density becomes large in the low density layer since the hole diffuses from the first layer 2a to the second layer 2b.

Thus, the hole density becomes large even in the second layer 2b as the low density layer, and therefore, it is possible to reduce the resistance. Further, the P type drift layer 2 has the δ dope structure, and it is not necessary to increase the total impurity amount (i.e., the surface density or the dose amount) for reducing the resistance. Accordingly, the maximum electric field intensity is not increased. Thus, it is possible to reduce the maximum electric field intensity and to reduce the resistance.

Further, in the present embodiment, the total impurity amount (i.e., the surface density or the dose amount) of the P type drift layer 2 having the δ dope structure is equal to or smaller than $1 \times 10^{13}$ cm$^{-2}$, and the pitch distance of the first layer 2a in the δ dope structure is equal to or smaller than 0.13 micrometers. These features are introduced because of the following reasons.

First, the reason why the total impurity amount (i.e., the surface density or the dose amount) in the δ dope structure is equal to or smaller than $1 \times 10^{13}$ cm$^{-2}$ will be explained.

Figure 3:
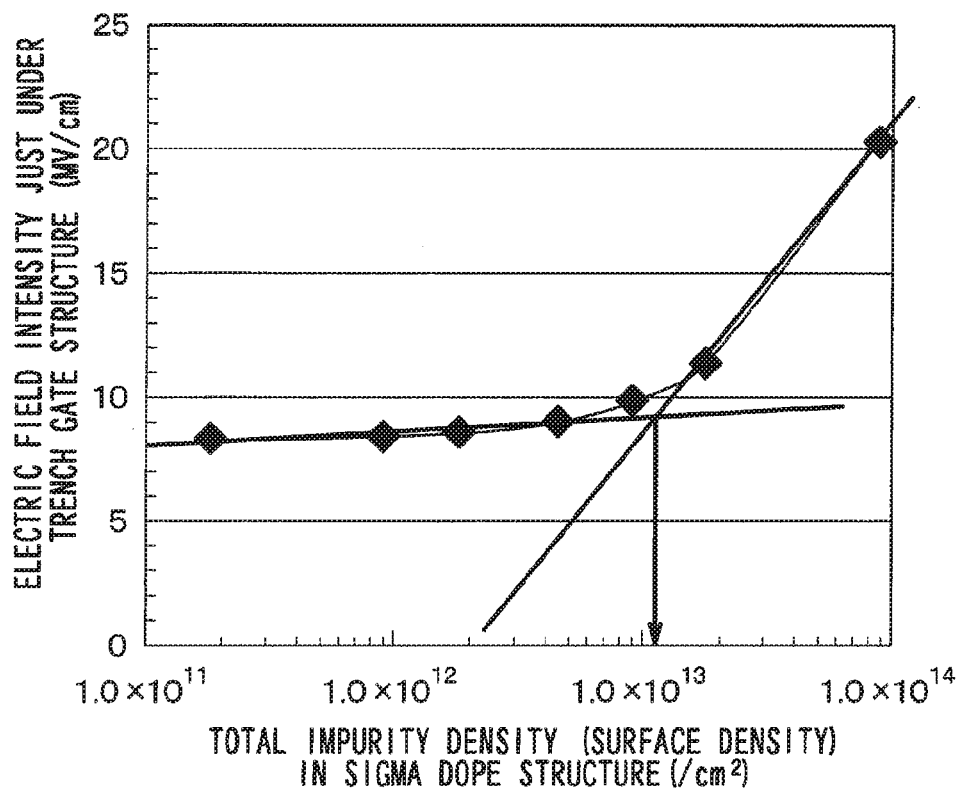
FIG. 3 is a diagram showing a measurement result of a relationship between an impurity density (i.e., a surface density) of a total impurities in a drift layer 2 having a P type conductivity in the sigma dope structure and an electric field intensity just under a trench gate structure.

The total impurity amount (i.e., the surface density or the dose amount) of the P type drift layer 2 having the δ dope structure is a parameter for determining the resistance of the P type drift layer 2. As the total impurity amount (i.e., the surface density or the dose amount) of the P type drift layer 2 becomes larger, the resistance of the P type drift becomes smaller, but the electric field intensity just under the trench gate structure becomes stronger. FIG. 3 shows a calculation result of a relationship between the total impurity amount (i.e., the surface density or the dose amount) of the P type drift layer 2 having the δ dope structure and the electric field intensity just under the trench gate structure.

As a result, as shown in FIG. 3, the electric field intensity in the diamond just under the trench gate structure is almost constant, and the insulation breakdown electric field intensity of the diamond is equal to or smaller than 10 MV/cm until the total impurity amount (i.e., the surface density or the dose amount) of the P type drift layer 2 reaches $1 \times 10^{13}$ cm$^{-2}$. The value of $1 \times 10^{13}$ cm$^{-2}$ shows a critical point, at which the electric field intensity increases when the impurity amount exceeds the value. When the impurity amount exceeds the value, the electric field intensity rapidly increases. Thus, the electric field intensity easily exceeds the insulation breakdown electric field intensity of the diamond, i.e., 10 MV/cm, so that the breakdown occurs. Accordingly, when the total impurity amount (i.e., the surface density or the dose amount) of the P type drift layer 2 is equal to or smaller than $1 \times 10^{13}$ cm$^{-2}$, it is possible to prevent the electric field intensity just under the trench gate structure from rapidly increasing. Thus, it is possible to prevent the reduction of the blocking voltage. Thus, the present inventors newly found a feature such that the total impurity amount has the critical point, at which the electric field intensity rapidly increases.

Next, the reason why the pitch distance of the first layer 2a in the δ dope structure is equal to or smaller than 0.13 micrometers will be explained.

Figure 5:
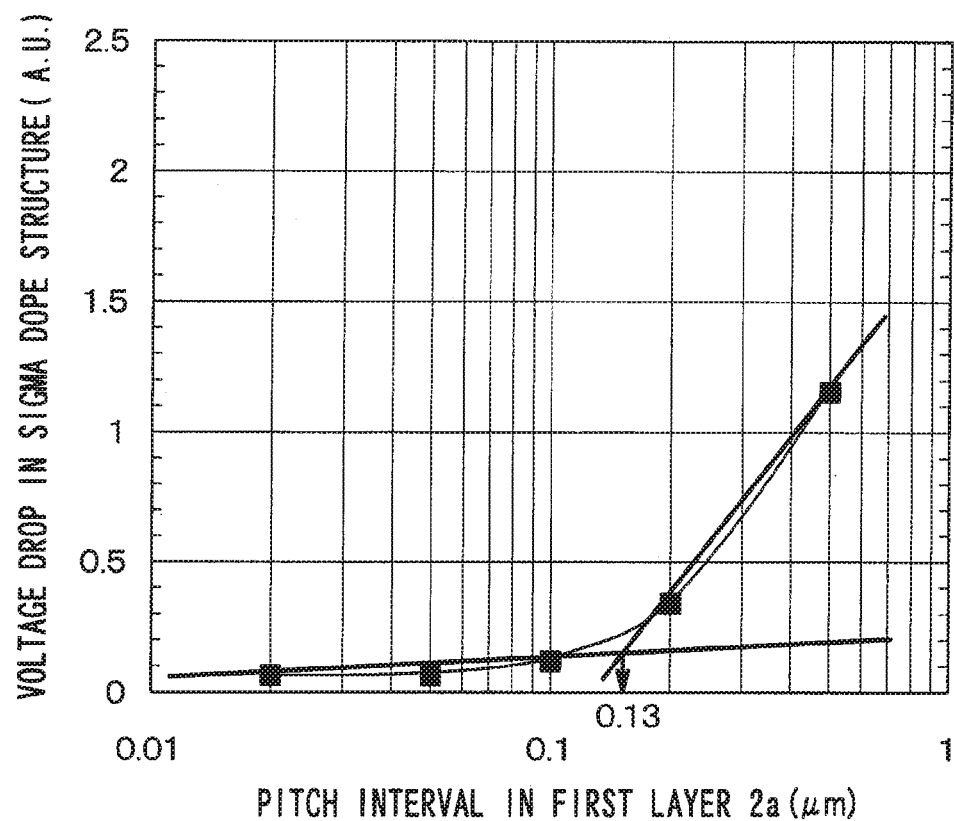
FIG. 5 is a diagram showing a measurement result of a relationship between a pitch interval of a first layer 2a and a voltage drop of a P type drift layer 2 in the sigma dope structure.

For example, under a condition that the thickness of the first layer 2a is a predetermined width, when the pitch distance of the first layer 2a is large, the thickness of the second layer 2b becomes thick. Accordingly, as the pitch distance of the first layer 2a becomes larger, the resistance of the P type drift layer 2 increases, and the voltage drop amount of the P type drift layer 2 becomes larger. FIG. 5 shows a calculation result of the relationship between the pitch distance of the first layer 2a and the voltage drop amount of the P type drifty layer 2 having the δ dope structure. The pitch distance of the first layer 2a is changed by changing the thickness of the second layer 2b. Here, the thickness of the δ dope structure is fixed to one micrometer, and the total impurity amount (i.e., the surface density or the dose amount) is constant, i.e., $1 \times 10^{13}$ cm$^{-2}$. The impurity amount is controlled by changing the number of the first layers 2a and the thickness of the first layer 2a under a condition that the maximum impurity density is constant.

As shown in the drawing, when the pitch distance of the first layer 2a in the P type drift layer 2 becomes wider, the voltage drop amount in the P type drift layer 2 is a low value and is not substantially changed when the pitch distance is equal to or smaller than 0.13 micrometers. However, when the pitch distance exceeds 0.13 micrometers, the voltage drop amount in the P type drift layer 2 rapidly increases. Accordingly, when the pitch distance is equal to or smaller than 0.13 micrometers, the increase of the voltage drop amount in the P type drift layer 2 is prevented, and it is possible to decrease the resistance of the P type drift layer 2. Thus, the present inventors newly found a feature such that the pitch distance has the critical point, at which the voltage drop amount rapidly increases, and the critical point is 0.13 micrometers.

The Non Patent Literature 1 already teaches that the resistance is reduced when the current flows in a lateral direction (i.e., a direction in parallel to the δ dope layer) as a result that the mobility is improved in the δ dope structure and the hole density is increased. However, when the current flows vertically (i.e., a direction crossing the δ dope layer) in the δ dope structure, a different feature is required. Specifically, since the δ dope layer is a barrier for the hole, an energy (i.e., a voltage) is necessary for the hole to move beyond the barrier. Further, the mobility is reduced. As a result, a difficulty that the resistance is not reduced arises conventionally.

However, the present inventors confirm according to the following method such that the resistance is reduced even when the current flows in the δ dope structure in the perpendicular direction of the δ dope layer. The following features are newly found by the present inventors.

Figure 4A:
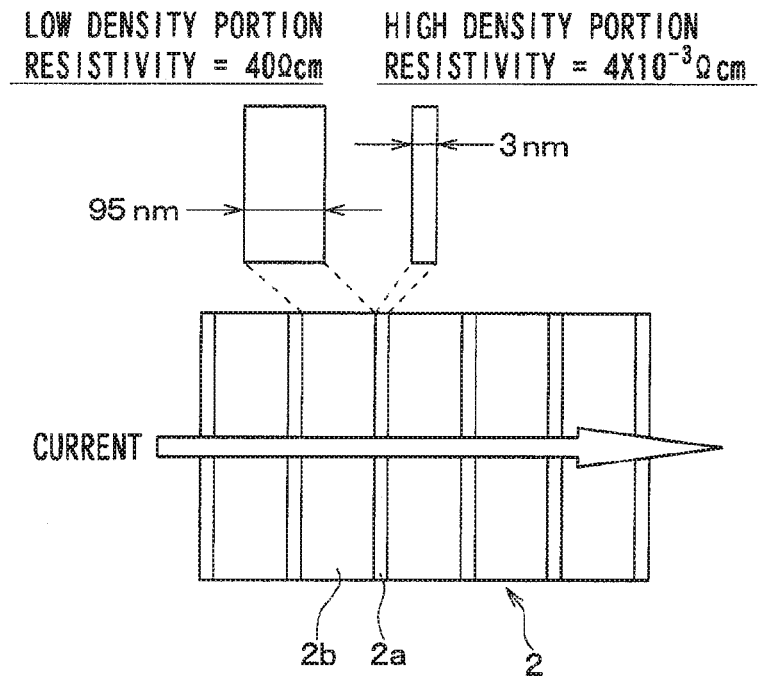
FIG. 4A is a schematic diagram of a sigma dope structure used in a measurement of FIG. 3.
Figure 4B:
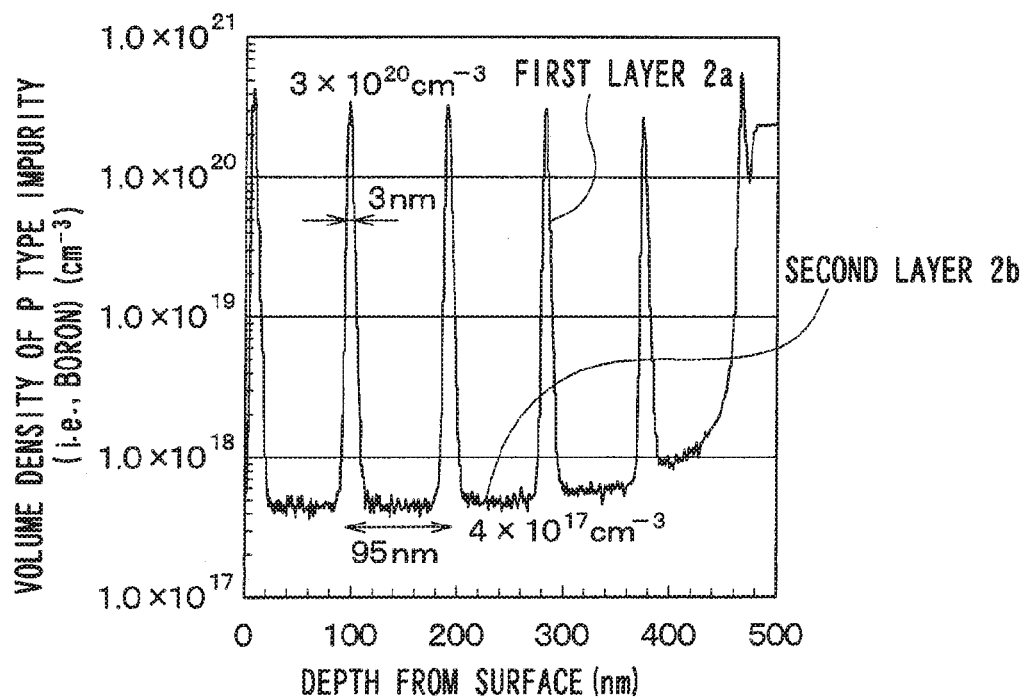
FIG. 4B is a diagram showing a concentration profile of a sigma dope structure used in a measurement of FIG. 3.

The following description explains a reduction effect of the resistance in the δ dope structure in the experiment. Here, as shown in FIG. 4A, the first layer 2a as a high density portion using boron as a P type impurity is formed with a thickness of 3 nanometers, and the second layer 2b as a low density portion is formed with a thickness of 95 nanometers. The δ dope structure having the concentration profile shown in FIG. 4B is formed. Then, the resistance is measured under a condition that the current flows perpendicularly to the first layer 2a. In this experiment, the volume density of boron in the first layer 2a is $3 \times 10^{20}$ cm$^{-3}$, and the volume density of boron in the second layer 2b is $4 \times 10^{17}$ cm$^{-3}$. As a result of the experiment, the resistivity of the first layer 2a as the high density layer is $4 \times 10^{-3}$ Ωcm as a single body, and the resistivity of the second layer 2b as the low density layer is 40 Ωcm as a single body. The resistivity in the δ dope structure in FIGS. 4A and 4B is calculated by simply adding the resistivity of the first layer 2a and the resistivity of the second layer 2b, which are stacked each other. In this case, the resistivity is 38 Ωcm. However, when the resistivity is actually measured, the resistivity is 2 Ωcm, and therefore, the actual resistivity is reduced to be one-twentieth.

As described above, in the semiconductor device according to the present embodiment, the P type drift layer 2 has the δ dope structure such that the first layer 2a and the second layer 2b are alternately arranged. the current flows in the vertical direction as a direction crossing the planar direction of each of the first layers 2a and each of the second layers 2b. When the δ dope structure using the hopping conduction is applied, the hole density is increased even in the second layer 2b as the low density layer, and it is possible to reduce the resistance. Further, since the impurity amount (i.e., the surface density) in the δ dope structure is small, the maximum electric field intensity is reduced. Specifically, in a device having the δ dope structure using the hopping conduction, a breakdown voltage is secured, and the resistance is reduced.

Second Embodiment

A second embodiment of the present disclosure will be explained. In the present embodiment, a semiconductor element in the semiconductor device according to the first embodiment is replaced. Other features are similar to the first embodiment. Different features from the first embodiment will be merely explained.

Figure 6:
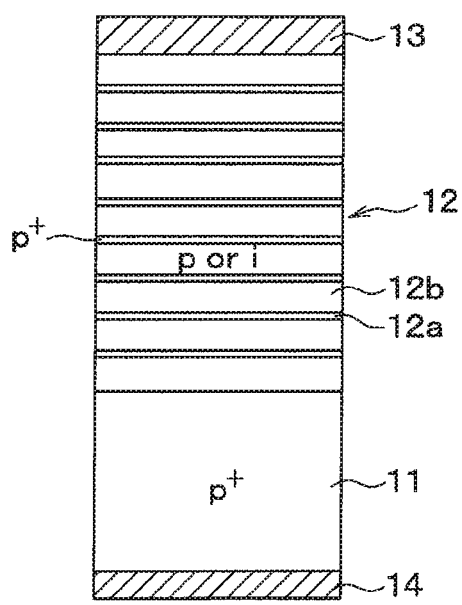
FIG. 6 is a cross sectional diagram showing a semiconductor device having a Schottky diode made of diamond semiconductor according to a second embodiment of the present disclosure.
Figure 7:
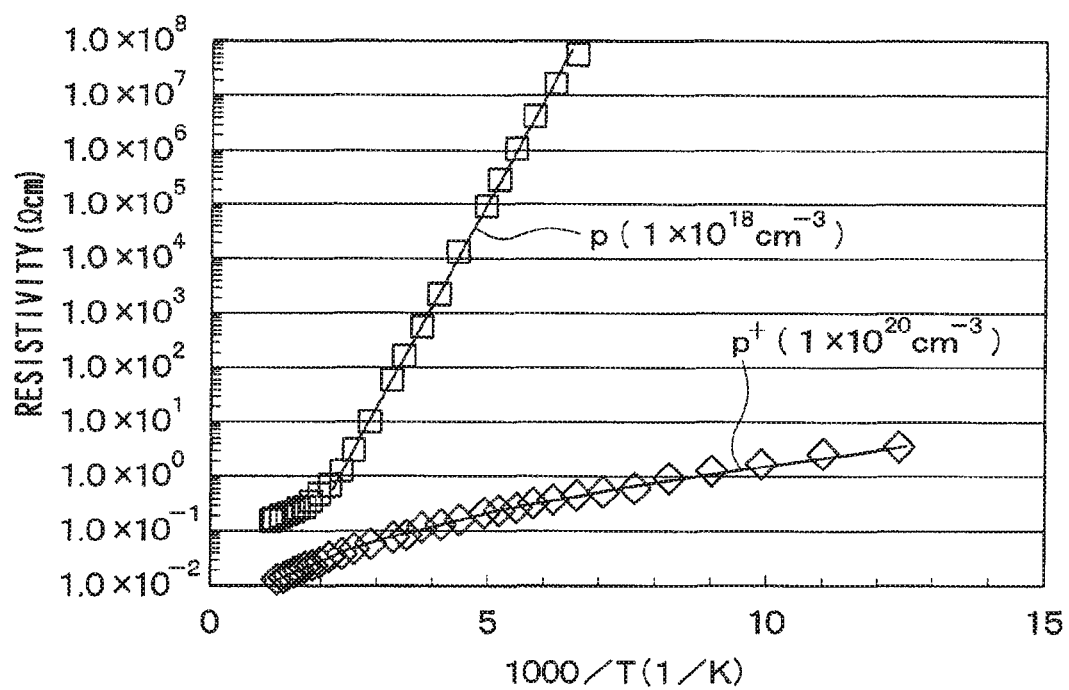
FIG. 7 is a diagram showing a relationship between temperature and resistivity in diamond semiconductor.

The semiconductor device according to the present embodiment includes a Schottky diode as the semiconductor element shown in FIG. 6. The Schottky diode has a structure such that the P type drift layer 12 is disposed on the P+ type diamond substrate 11, the Schottky electrode 13 is disposed on the P type drift layer 12, and the backside electrode 14 is disposed on a backside of the P+ type diamond substrate 1.

Similar to the P type drift layer 2 explained in the first embodiment, the P type drift layer 12 is provided by the δ dope layer having a structure such that the first layer 12a and the second layer 12b are alternately repeated. The Schottky electrode 13 corresponds to the first electrode, and the electrode 13 is made of metallic material, which contacts the P type drift layer 12 in a Schottky contact manner. The backside electrode 14 corresponds to the second electrode, and the electrode 14 is made of the metallic material, which contacts the P+ type diamond substrate 11 in an Ohmic contact manner.

Thus, even when the Schottky diode is equipped as the semiconductor element, the P type drift layer 12 is provided by the δ dope layer. In such a structure, the P type drift layer 12 provides similar effects as the first embodiment. Thus, the maximum electric field intensity is reduced, and the resistance is also reduced.

Here, the Schottky diode having the δ dope layer is disclosed in A. Denisenko, E. Kohn, DIAMOND AND RELATED MATERIALS "Diamond power devices. Concepts and limits," Diamond & Related Materials 14(2005), page 491 to page 489. However, this document merely teaches that the drift layer is provided by the δ dope layer. Therefore, the document does not teach a relationship with the total impurity amount of the drift layer. On the other hand, in the Schottly diode according to the present embodiment, the total P type impurity amount of the δ dope layer, which provides the P type drift layer 12, is equal to or smaller than $1 \times 10^{13}$ cm$^{-2}$, similar to the first embodiment. Thus, the effects, which are not obtained by the above document, are obtained such that the maximum electric field intensity is reduced, and the resistance is also reduced.

Other Embodiments

For example, in the above embodiments, the semiconductor device made of diamond semiconductor with the δ dope structure is the MISFET or the Schottly diamond as an example. Alternatively, the present disclosure may be applied to other devices. Specifically, as long as the δ dope structure is formed such that the first layer 2a having the first density, in which the impurity density is increased so as to provide the hopping conduction dominantly, and the second layer 2b having the second density lower than the first density are alternately stacked each other, and the current flows in the vertical direction as a direction crossing the planar direction of each first layer 2a and each second layer 2b, the other devices provide the effects. Here, the direction crossing the planar direction of each first layer 2a and each second layer 2b includes a direction diagonally crossing the planar direction in addition to a direction perpendicularly crossing as long as the direction crosses the planar direction. For example, a sidewall of the trench gate in the trench gate structure may tilt.

Further, in the above embodiments, the semiconductor device includes the P channel type MISFET. Alternatively, the semiconductor device may include the N channel type MISFET, in which the conductive type of each element is reversed. Further, the semiconductor device may be a planar type MISFET in addition to the MISFET having the trench gate structure. Alternatively, the semiconductor device may be semiconductor devices other than the MISFET such as the semiconductor device having the Schottly diode, similar effects are obtained.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor device comprising:
a MISFET as a semiconductor element, wherein:
the MISFET includes:
    a diamond substrate having a first conductive type and made of diamond semiconductor;
    a drift layer having a first layer with the first conductive type and a first density for providing a hopping conduction and a second layer with the first conductive type or an I type and a second density lower than the first density, and made of diamond semiconductor with a δ dope structure, in which the first layer and the second layer are alternately repeated;
    a body layer having a second conductive type, made of diamond semiconductor, and arranged on the drift layer;
    a source region having the first conductive type, made of diamond semiconductor, and arranged in an upper portion of the body layer;
    a gate insulation film arranged on a surface of the body layer, a part of the body layer contacting the gate insulation film providing a channel region;
    a gate electrode arranged on a surface of the gate insulation film;
    a first electrode electrically connected to the source region and the channel region; and
    a second electrode electrically connected to the diamond substrate;
the MISFET flows current in the drift layer in a vertical direction as a direction crossing a plane of the first layer and the second layer, and the current flows between the first electrode and the second electrode.

2. The semiconductor device according to claim 1, wherein:
a total impurity amount of the first conductive type in the drift layer is equal to or smaller than $1 \times 10^{13}$ cm$^{-2}$.

3. The semiconductor device according to claim 1, wherein:
the MISFET further includes a trench that penetrates the body layer and reaches the drift layer;
the gate insulation film is disposed on an inner wall of the trench;
the gate electrode is disposed in the trench through the gate insulation film; and
the source region contacts a sidewall of the trench.

4. The semiconductor device according to claim 1, wherein:
a pitch distance as a distance between centers of adjacent two first layers is equal to or smaller than 0.13 micrometers.

5. The semiconductor device according to claim 4, wherein:
a thickness of the first layer is equal to or smaller than 1 nanometer.

6. A semiconductor device comprising:
a Schottky diode as a semiconductor element, wherein:
the Schottky diode includes:
    a diamond substrate having a first conductive type and made of diamond semiconductor;
    a drift layer having a first layer with the first conductive type and a first density for providing a hopping conduction and a second layer with the first conductive type or an I type and a second density lower than the first density, and made of diamond semiconductor with a δ dope structure, in which the first layer and the second layer are alternately repeated;
    a first electrode provided by a Schottly electrode and electrically contacting the drift layer in a Schottly contact manner; and
    a second electrode electrically connected to the diamond substrate;
the Schottky diode flows current in the drift layer in a vertical direction as a direction crossing a planar direction of the first layer and the second layer, and the current flows between the first electrode and the second electrode; and
a total impurity density of the first conductive type in the drift layer is equal to or smaller than $1 \times 10^{13}$ cm$^{-2}$.

7. The semiconductor device according to claim 6, wherein:
a pitch distance as a distance between centers of adjacent two first layers is equal to or smaller than 0.13 micrometers.

8. The semiconductor device according to claim 7, wherein:
a thickness of the first layer is equal to or smaller than 1 nanometer.

* * * * *